(12) United States Patent
Sexton et al.

(10) Patent No.: US 6,230,402 B1
(45) Date of Patent: May 15, 2001

(54) ELECTRICAL CONTACT TERMINATION FOR A FLEXIBLE CIRCUIT

(75) Inventors: Richard W. Sexton, Huber Heights; James E. Harrison, Jr., Dayton, both of OH (US)

(73) Assignee: Scitex Digital Printing, Inc., Dayton, OH (US)

( * ) Notice: Subject to any disclaimer, the term of this patent is extended or adjusted under 35 U.S.C. 154(b) by 0 days.

(21) Appl. No.: 09/251,165

(22) Filed: Feb. 17, 1999

(51) Int. Cl.$^7$ .................................................. H01R 43/04
(52) U.S. Cl. ............................................. 29/846; 174/254
(58) Field of Search .................. 439/66, 91, 67; 174/260, 261, 263, 264, 266, 68.5, 255; 361/406, 406.8, 404; 29/846, 848

(56) References Cited

U.S. PATENT DOCUMENTS

| | | | |
|---|---|---|---|
| 4,706,167 | * 11/1987 | Sullivan | 361/406 |
| 4,725,925 | * 2/1988 | Tamaka et al. | 361/406 |
| 4,944,087 | * 7/1990 | Landi | 29/848 |
| 5,006,673 | * 4/1991 | Freyman et al. | 174/225 |
| 5,124,508 | * 6/1992 | DuBrucq | 174/260 |
| 5,194,698 | * 3/1993 | Souto et al. | 174/250 |
| 5,197,184 | * 3/1993 | Crumly et al. | 29/846 |
| 5,478,973 | * 12/1995 | Yoon et al. | 174/260 |
| 5,619,399 | * 4/1997 | Mok | 361/707 |
| 5,631,447 | * 5/1997 | Smith et al. | 174/260 |

FOREIGN PATENT DOCUMENTS

740334 * 11/1996 (EP) ..................................... 21/311

* cited by examiner

*Primary Examiner*—Neil Abrams
*Assistant Examiner*—J. F. Duverne
(74) *Attorney, Agent, or Firm*—Barbara Joan Haushalter

(57) ABSTRACT

A method is provided for fabricating a flexible circuit having at least one raised bump associated with a contact pad. A sacrificial conductive mandrel is provided having a depression located to correspond with each raised bump contact. A conductive metal pattern is electroformed on selected portions of the sacrificial conductive mandrel, corresponding to a desired electrical lead pattern and the contact pad. A non-conductive polymeric sheet is applied as a base material for the flexible circuit, and laminated to the sacrificial conductive mandrel on the face having the conductive metal pattern thereon. An etchant, capable of removing the sacrificial conductive mandrel without etching or removing metal of the conductive metal pattern, is employed to remove the sacrificial conductive mandrel from the polymeric sheet to which the mandrel and the conductive metal pattern are laminated.

17 Claims, 4 Drawing Sheets

ELECTRICAL CONTACT TERMINATION FOR A FLEXIBLE CIRCUIT

TECHNICAL FIELD

The present invention relates to flexible circuit fabrication and more particularly to a tactile contact termination for a flexible circuit.

BACKGROUND ART

In many electronic applications, there exists a need for high density electrical connections. One such means to produce high density interconnects is described in U.S. Pat. No. 4,125,310. In this patent, the two circuits to be connected have contact pads which mirror each other so the contact pads from one circuit can be brought into contact with their corresponding contact pads of the mating circuit. The contact pads of one of the circuits are raised above the plane of the rest of the circuit. When the circuits are brought together, the raised contact pads serve to concentrate the clamping force. In this way, the contact pads can be brought into contact with each other with sufficient force to ensure electrical continuity through the connection.

A variety of later means have been proposed to produce such raised bump connections. Most of these inventions involve means to make the raised bumps on a flexible circuit, where the electrical circuit is laminated to an insulating sheet such as Kapton polyimide. One such means to produce the raised bump contacts, disclosed in U.S. Pat. No. 4,116,517, involves forming the electrical circuit on the insulating sheet and then permanently deforming the circuit by some suitable tool to produce the raised bumps. Another means, described in, for example, U.S. Pat. Nos. 5,354,205 and 5,307,561 and 5,364,277, involves electroforming the circuitry with the raised bumps. In each of these patents, depressions are formed in a mandrel which is usually made of a stainless steel. These depressions can be made by any suitable tool. The locations of these depressions correspond to the intended locations of the raised bumps on the circuit. The surface of the mandrel is then selectively masked by a non-conductive coating such as Teflon. The unmasked areas correspond to the conductive traces and contact pads of the flex circuit. The masked area corresponds to the non conductive spaces around the intended circuit traces. The mandrel is then subjected to an electroforming process to electrodeposit a layer of conductive material over the entire unmasked portion of the mandrel. The electroformed circuitry, which is still attached to the mandrel, is then laminated to the insulating sheet material. The insulating sheet with the laminated circuitry is removed by a peeling operation from the mandrel. As the electroformed circuitry replicates the surface topology of the mandrel, the circuitry is produced with raised bumps corresponding to the depressions of the mandrel. After the circuitry has been removed from the mandrel, the mandrel may be reused to make additional raised bump circuits.

While the methods for producing raised bump contacts have been quite effective, at high contact and circuit trace densities these processes are prone to failure. It has been believed that these failures may be caused by stresses required to deform the pads, such as in the '517 patent. With the more recent prior art processes, involving electroforming, it is believed that the high failures rates may be induced by the stresses required to peel the laminated circuitry from the reusable mandrel and from degradation of the costly reusable mandrel. At lower contact and circuit trace densities, the wider traces can withstand these stresses without failure.

It is seen, then, that a means is needed to form high density interconnects without introducing failure-inducing stresses.

SUMMARY OF THE INVENTION

This need is met by the present invention, wherein a sacrificial metal is used as a mandrel. These sacrificial metal substrates are indented with a sharply pointed punch and a pattern of flexible circuit conductors are electroformed on the metal substrate and connect to the pointed termination which is simultaneously formed in the indent. The circuit is laminated to a flexible carrier film and the metal substrate is etched completely away, leaving the circuit lines with pointed termination contacts on the nonconductive carrier film, forming a flexible circuit.

In accordance with one aspect of the present invention, a method is provided for fabricating a flexible circuit having at least one raised bump associated with a contact pad. A sacrificial conductive mandrel is provided having a depression located to correspond with each raised bump contact. A conductive metal pattern is electroformed on selected portions of the sacrificial conductive mandrel, corresponding to a desired electrical lead pattern and the contact pad. A non-conductive polymeric sheet is applied as a base material for the flexible circuit, and laminated to the sacrificial conductive mandrel on the face having the conductive metal pattern thereon. An etchant, capable of removing the sacrificial conductive mandrel without etching or removing metal of the conductive metal pattern, is employed to remove the sacrificial conductive mandrel from the polymeric sheet to which the mandrel and the conductive metal pattern are laminated.

Other objects and advantages of the invention will be apparent from the following description and the appended claims.

DETAILED DESCRIPTION OF THE INVENTION

Figure 1:
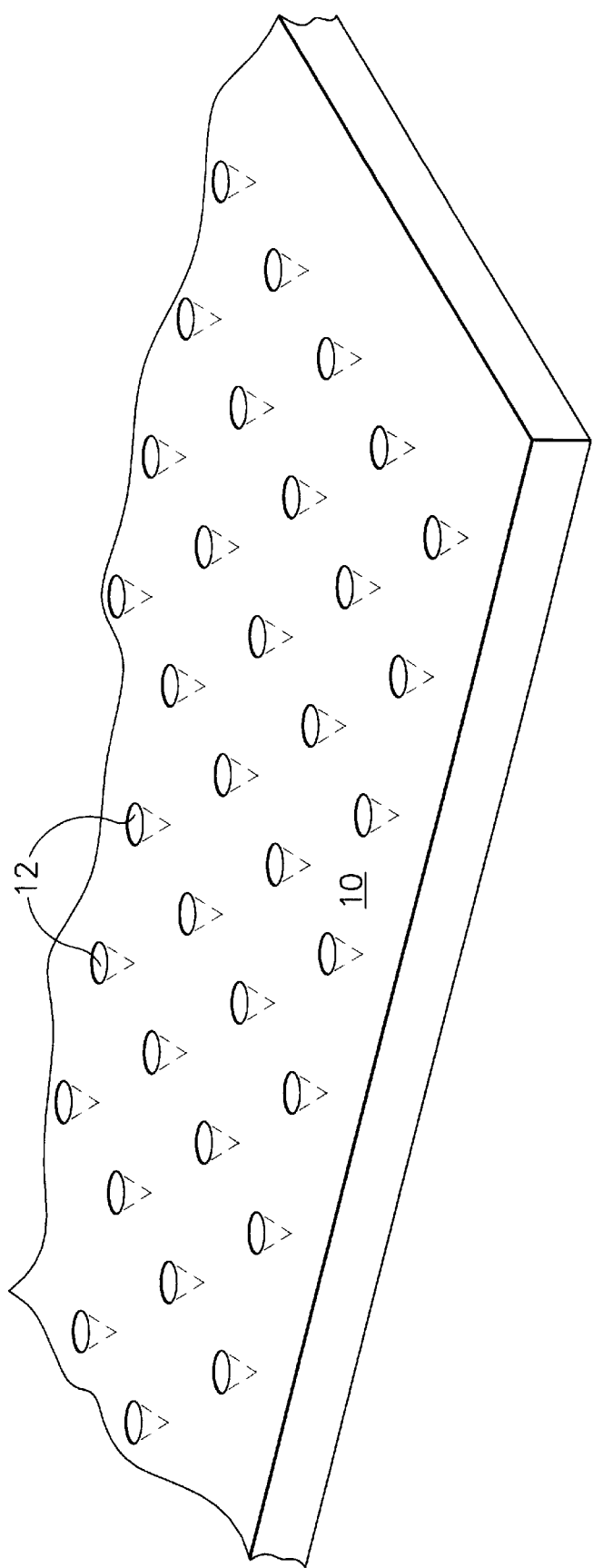
FIG. 1 illustrates a substrate with indentations formed therein, in accordance with the present invention.
Figure 2:
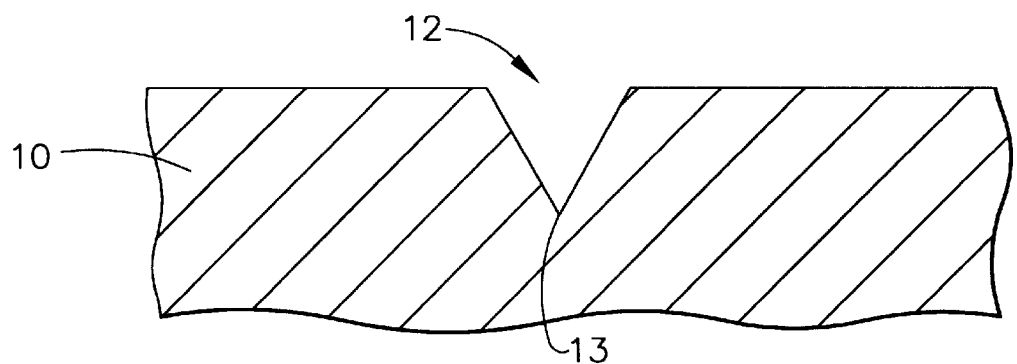
FIG. 2 is a side view of one indented portion of FIG. 1.
Figure 3:
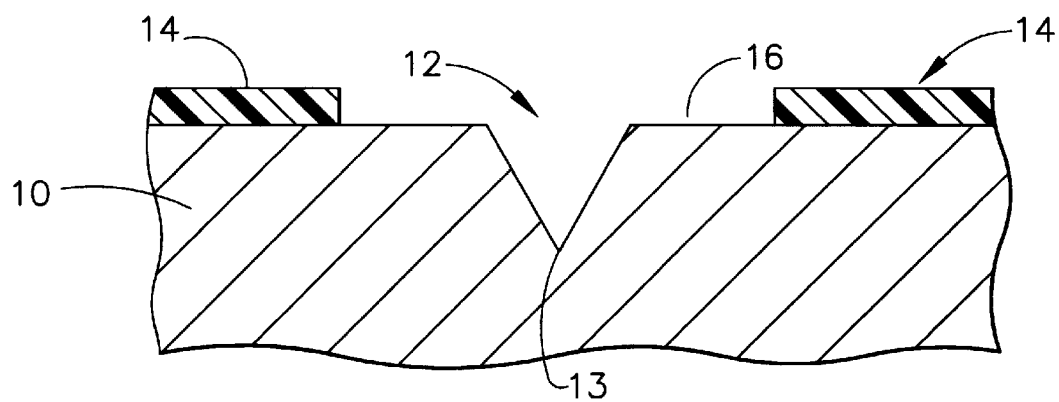
FIG. 3 illustrates the side view of FIG. 2 with a photoresist pattern added thereon.
Figure 4:
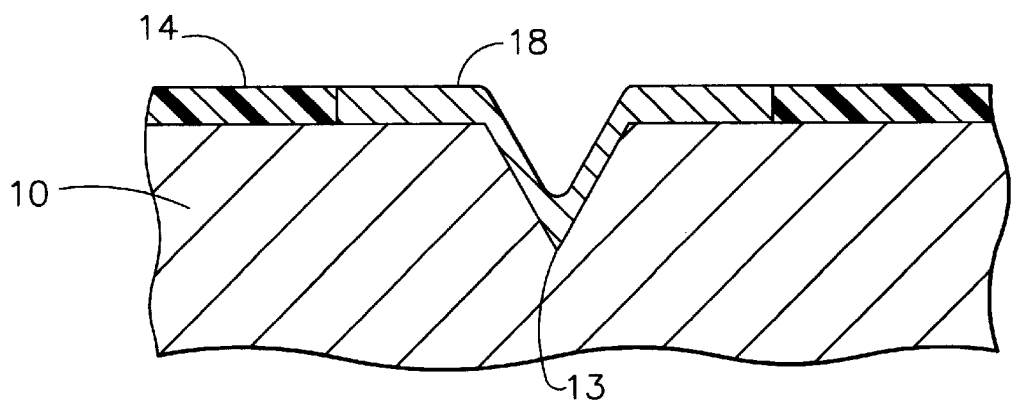
FIG. 4 adds a plating layer to the structure of FIG. 3.
Figure 5:
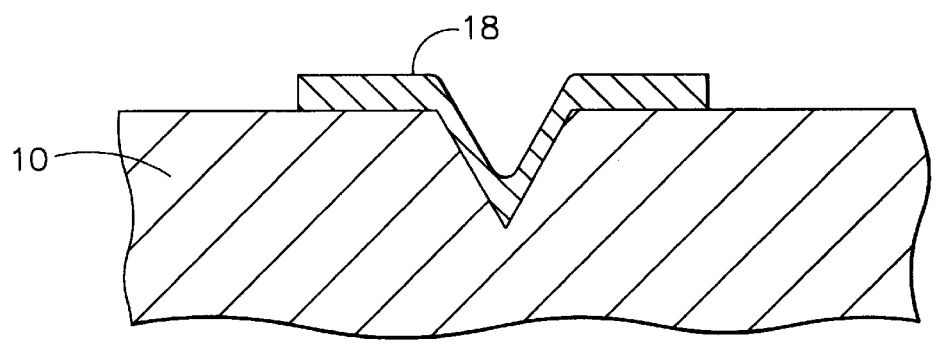
FIG. 5 illustrates the removal of the photoresist layer, after the plating step of FIG. 4.
Figure 6:
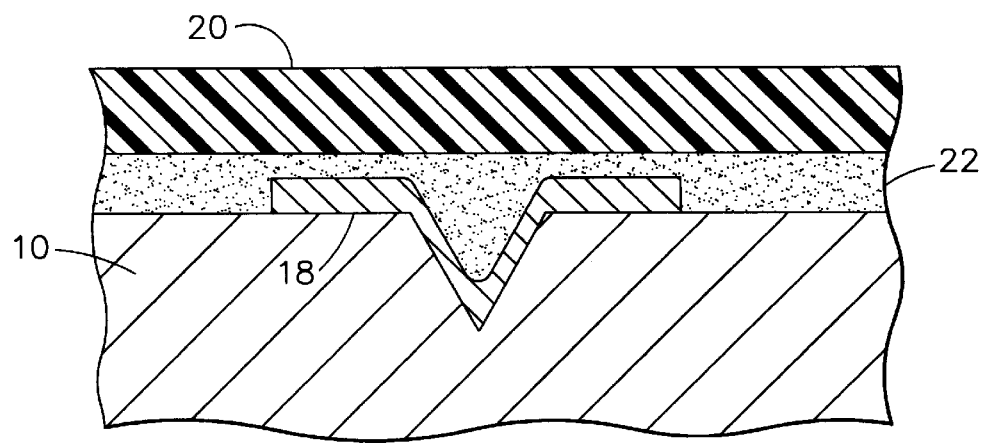
FIG. 6 shows a non-conductive polymeric sheet with an adhesive, applied to the structure of FIG. 5.
Figure 7:
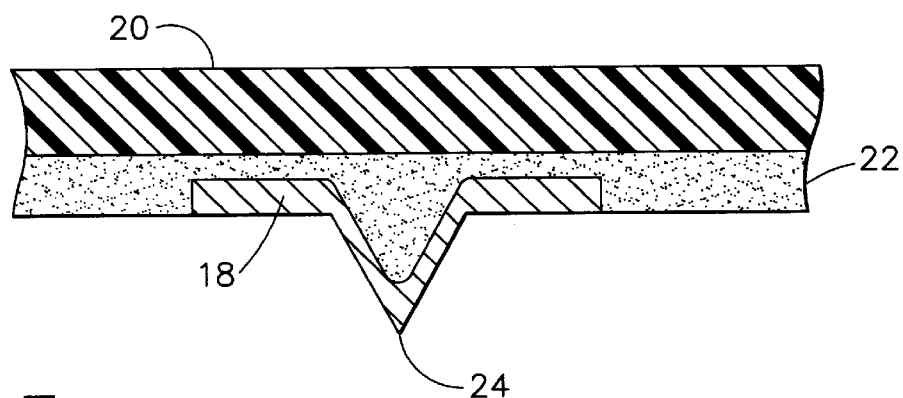
FIG. 7 shows the final structure after the substrate is etched away.
Figure 8:
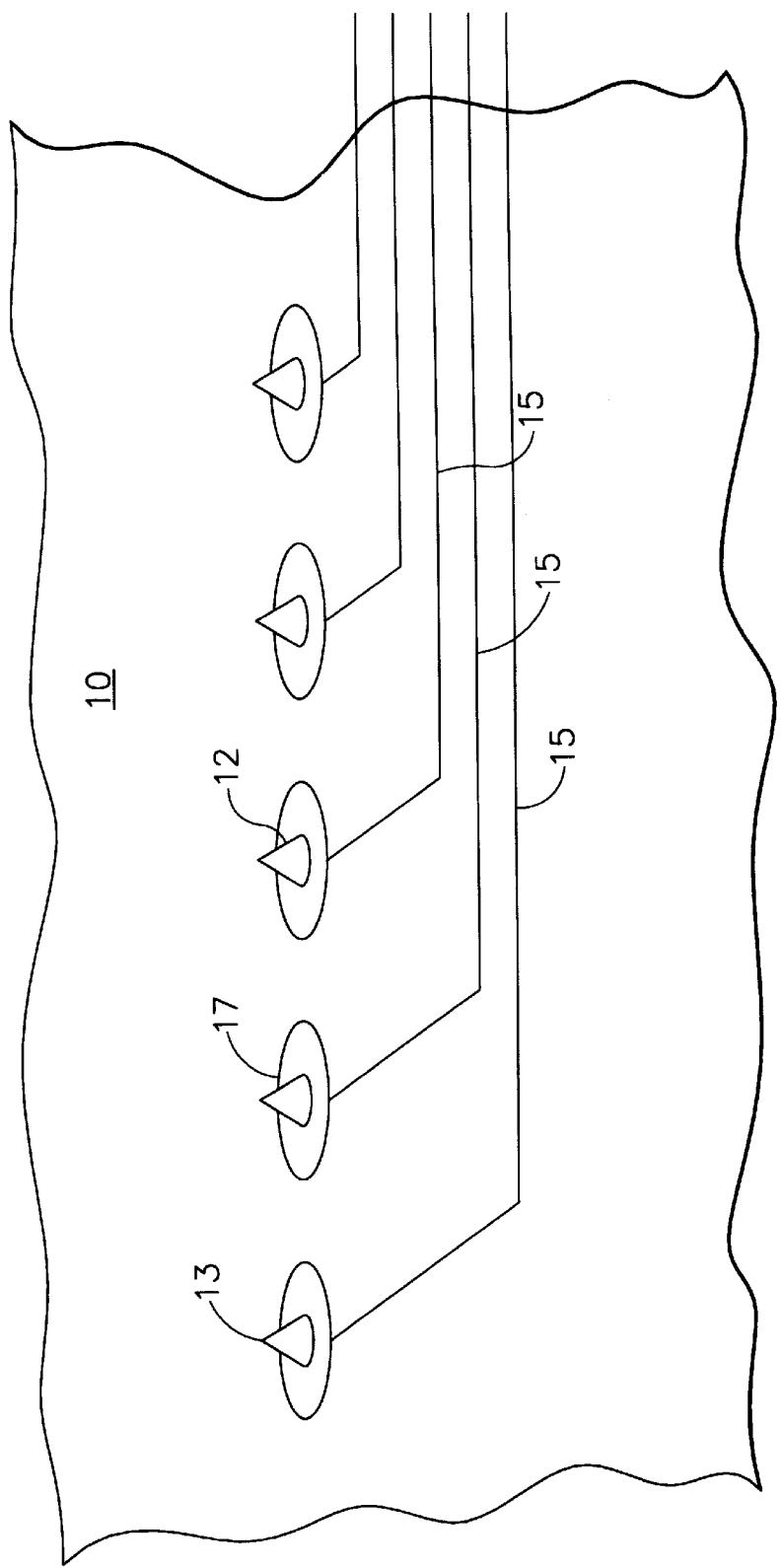
FIG. 8 illustrates the electrode pattern connected to the contact pads with the pointed termination points replicated from the indentions formed thereon.

The present invention proposes using a sacrificial conductive metal as a mandrel or substrate 10, as shown in FIG. 1. Such mandrels are indented with a sharply pointed punch, forming indentations 12, with point 13 shown in the side view of FIG. 2. The desired electrode pattern for the flexible circuit is defined by means of a photoresist masking layer 14, as shown in FIG. 3. The unmasked areas 16 correspond to the desired conductor regions of the circuit. An electrode pattern 15, or pattern of flexible circuits, is then electroformed on the mandrel, with a desired electrical lead pattern, or electrode pattern 15, shown in FIG. 8. Nickel 18 is plated into the unmasked areas, as shown in FIG. 4, and the photoresist layer 14 can be removed, as shown by FIG. 5. The structure is then laminated to a flexible carrier sheet, or polymeric sheet, 20, having an adhesive layer 22 thereon, as illustrated in FIG. 6. The polymeric sheet is typically a polyimide material. The adhesive layer is typically a B stage epoxy or an acrylic adhesive. Rather than peel the circuit from the mandrel, with the resultant damage created thereby, the present invention proposes completely etching away the mandrel 10, as shown by FIG. 7. As etching is a stress free process, the failures produced by the stresses of the prior art are eliminated. This allows higher density interconnects to be formed, with the interconnects 15 shown in FIG. 8. A cover layer can be applied over the conductive leads of the circuit, for example to provide insulation.

The mandrels of the prior art tended to be quite costly. These costs were the result of attempting to make the mandrels reusable. This required the mandrel to have a durable coating to serve as an electroforming mask and to allow the electroformed and laminated circuit to be removable from the mandrel. In the present invention, the mandrel 10 is used only once. Therefore durable, but costly, coatings of the mandrel are not required. Although the present invention does require a mandrel to be produced with the desired depression pattern for each circuit produced, the depressions are not costly to produce, as they can be quickly produced by high speed punching machines. Using one such machine, which can produce 15 depressions per second, mandrels for producing connectors having 1080 raised bump contacts can be processed in less than two minutes.

The present invention of a pointed contact termination for a flexible cable structure results in the formation of raised bumps. Electroformed circuits can be made without damage or stress by using a sacrificial, selectively etched substrate that is compatible with the electroformed circuitry.

The substrate 10 in FIG. 1, preferably made of copper alloy, copper, brass or beryllium copper, or aluminum, is provided with a thickness of at least about 0.030 inches. This substrate 10 is indented, as at multiple indentations 12, with a suitable means, such as a sharply pointed punch. A side view of an indentation 12 is illustrated in FIG. 2. The indentations can be replicated in relief by plating into the dents and then etching away the substrate. A pad area 17 is comprised of the indentations 12 with the pointed termination 13 centered in the pad area. For forming a circuit having the bumps, the indented substrate 10 is first coated with photoresist 14 including a conductor pattern, as shown in FIG. 3, developed adjacent to the pads and aligned to include the dent structure in the center of the termination pad.

In FIG. 4, nickel 18 is electroformed or plated into the indentations 12 and the unmasked areas, before removing the photoresist, as shown by FIG. 5. To form a flexible circuit, the substrate 10 with the electroformed conductors is brought in contact with a commercially available polyimide carrier sheet 20 having an adhesive layer 22, as illustrated in FIG. 6. The polymeric sheets are usually 0.001 to 0.005 inches thick and have from 0.001 to 0.002 inches of adhesive applied thereon. The lamination is carried out in a heated high pressure press, heated for example to 350° F. with an applied pressure of 300 pounds per square inch, causing the adhesive 22 to flow into the depressions created by the plated area 18. After removal from the press, the substrate 10 is selectively removed in an etching solution, preventing damage to the Nickel circuit or carrier sheet. If the substrate 10 is copper or brass, an ammoniacal etchant of pH9, such as is used for printed circuit boards, for example, an ammonia-base chlorite solution, can be used and if the substrate 10 is an aluminum substrate, a solution of potassium hydroxide or sodium hydroxide can be used as an etchant.

With the technique of the present invention, dissolution of the metallic substrate can be achieved without damage or stress to the electroformed bumps or to fine circuit lines even less than 0.001 inch in width. The circuit lines remain firmly bonded to the polyimide sheet support. The structure is useful in a high resolution ink jet printhead for making electrical connection from the charge plate to the circuit board containing the charge driver circuitry.

The invention has been described in detail with particular reference to certain preferred embodiments thereof, but it will be understood that modifications and variations can be effected within the spirit and scope of the invention.

What is claimed is:

1. A method for fabricating a flexible circuit having at least one contact pad with an associated at least one raised bump contact, the method comprising the steps of:
   providing a sacrificial conductive mandrel having at least one depression located to correspond with the at least one raised bump contact;
   providing means to electroform a conductive metal pattern on selected portions of at least one face of the sacrificial conductive mandrel, corresponding to a desired electrical lead pattern and the at least one contact pad;
   providing a non-conductive polymeric sheet as a base material for the flexible circuit;
   laminating the non-conductive polymeric sheet to the sacrificial conductive mandrel on the at least one face having the conductive metal pattern thereon;
   providing an etchant capable of removing the sacrificial conductive mandrel without etching or removing metal of the conductive metal pattern;
   employing the etchant to remove the sacrificial conductive mandrel from the polymeric sheet to which the mandrel and the conductive metal pattern are laminated.

2. A method as claimed in claim 1 wherein the sacrificial conductive mandrel comprises a copper alloy.

3. A method as claimed in claim 1 wherein the conductive metal pattern comprises nickel.

4. A method as claimed in claim 1 wherein the non-conductive polymeric sheet comprises a polyimide sheet.

5. A method as claimed in claim 1 wherein the step of providing a means to electroform a conductive metal pattern on selective portions of the mandrel comprises using photoresist as an electroforming mask.

6. A method as claimed in claim 1 wherein the etchant comprises an ammoniacal etchant.

7. A method as claimed in claim 6 wherein the etchant comprises an ammonia-base, chlorite solution that does not etch nickel.

8. A method as claimed in claim 1 wherein the etchant comprises potassium hydroxide or sodium hydroxide.

9. An apparatus for making printed images which utilizes flexible circuits made using the method claimed in claim 1.

10. A flexible circuit comprising:
    at least one contact pad with an associated at least one raised bump contact;
    a sacrificial conductive mandrel having at least one depression located to correspond with the at least one raised bump contact;

means for electroforming a conductive metal pattern on selected portions of at least one face of the sacrificial conductive mandrel, corresponding to a desired electrical lead pattern and the at least one contact pad;

a non-conductive polymeric sheet for use as a base material for the flexible circuit;

means for laminating the non-conductive polymeric sheet to the sacrificial conductive mandrel on the at least one face having the conductive metal pattern thereon;

an etchant for removing the sacrificial conductive mandrel from the non-conductive polymeric sheet to which the mandrel and the conductive metal pattern are laminated, without etching or removing metal of the conductive metal pattern.

11. A flexible circuit as claimed in claim 10 wherein the sacrificial conductive mandrel comprises a copper alloy.

12. A flexible circuit as claimed in claim 10 wherein the conductive metal pattern comprises nickel.

13. A flexible circuit as claimed in claim 10 wherein the non-conductive polymeric sheet comprises a polyimide sheet.

14. A flexible circuit as claimed in claim 10 wherein the means for electroforming a conductive metal pattern on selective portions of the mandrel further comprises means for using photoresist as an electroforming mask.

15. A flexible circuit as claimed in claim 10 wherein the etchant comprises an ammoniacal etchant.

16. A flexible circuit as claimed in claim 15 wherein the etchant comprises an ammonia-base, chlorite solution that does not etch nickel.

17. A flexible circuit as claimed in claim 10 wherein the etchant comprises potassium hydroxide or sodium hydroxide.

* * * * *